(12) United States Patent
Liu et al.

(10) Patent No.: US 12,408,398 B2
(45) Date of Patent: Sep. 2, 2025

(54) POWER SEMICONDUCTOR DEVICE AND PREPARATION METHOD THEREOF

(71) Applicant: JSAB Technologies (Shenzhen) Ltd., Shenzhen (CN)

(72) Inventors: Yong Liu, Shenzhen (CN); Hao Feng, Shenzhen (CN); Johnny Kin On Sin, Shenzhen (CN)

(73) Assignee: JSAB TECHNOLOGIES (SHENZHEN) LTD., Guangdong (CN)

( * ) Notice: Subject to any disclaimer, the term of this patent is extended or adjusted under 35 U.S.C. 154(b) by 421 days.

(21) Appl. No.: 18/095,217

(22) Filed: Jan. 10, 2023

(65) Prior Publication Data

US 2023/0343827 A1    Oct. 26, 2023

(30) Foreign Application Priority Data

Apr. 26, 2022  (CN) .......................... 202210440811.8

(51) Int. Cl.
- *H10D 62/17* (2025.01)
- *H10D 8/00* (2025.01)
- *H10D 12/00* (2025.01)
- *H10D 12/01* (2025.01)

(52) U.S. Cl.
CPC ............. *H10D 62/177* (2025.01); *H10D 8/00* (2025.01); *H10D 12/038* (2025.01); *H10D 12/481* (2025.01)

(58) Field of Classification Search
CPC ...... H10D 62/177; H10D 8/00; H10D 12/038; H10D 12/481; H10D 62/393
See application file for complete search history.

(56) References Cited

U.S. PATENT DOCUMENTS

| | | | |
|---|---|---|---|
| 2018/0097093 A1* | 4/2018 | Pfirsch | H10D 12/481 |
| 2018/0190649 A1* | 7/2018 | Laven | H10D 12/038 |
| 2022/0013645 A1* | 1/2022 | Shimosawa | H10D 64/231 |

FOREIGN PATENT DOCUMENTS

| | | |
|---|---|---|
| CN | 107887431 A | 4/2018 |
| CN | 110277443 A | 9/2019 |
| CN | 110504310 A | 11/2019 |
| CN | 111129134 A | 5/2020 |
| CN | 111415992 A | 7/2020 |
| WO | WO-2021232807 A1 | 11/2021 |

\* cited by examiner

*Primary Examiner* — Syed I Gheyas (74) *Attorney, Agent, or Firm* — MUNCY, GEISSLER, OLDS & LOWE, P.C.

(57) ABSTRACT

Disclosed are a power semiconductor device and a preparation method thereof, which belongs to the field of power semiconductor devices. By introducing a punch-through triode structure for electron extraction in a drift region, the frontside hole injection efficiency is reduced, and hole currents from emitters are converted into electron drift currents without significantly increasing on-state voltage drop. In addition, by changing the density and topography of a frontside trench, the adjustment of punch-through area and position is achieved, which in turn changes the electron extraction and frontside hole injection efficiency. The disclosed method increases the design flexibility and design dimension of the device.

4 Claims, 9 Drawing Sheets

POWER SEMICONDUCTOR DEVICE AND PREPARATION METHOD THEREOF

FIELD OF TECHNOLOGY

The present disclosure belongs to the field of power semiconductor devices, relates to an insulated gate bipolar transistor (IGBT), and in particular relates to a reverse conducting-insulated gate bipolar transistor (RC-IGBT) device and a preparation method thereof.

BACKGROUND

Reverse conducting-insulated gate bipolar transistor (RC-IGBT) device, as an insulated gate bipolar transistor (IGBT) and a free-wheeling diode (FWD) are integrated in the same cell, has advantages such as increased power density, reduced parasitic inductance, and increased chip area utilization of the device compared to a manner of encapsulated integration of discrete IGBT and FWD into a single device by wire bonding. The RC-IGBT, by virtue of the advantages of high integration, has gained popularity in soft switching circuits, especially induction heating applications. But it cannot be further generalized in hard switching applications due to the limitations such as switching frequency and switching losses. Excessive reverse recovery loss of FWD is one of the power consumption issues that urgently needs to be solved for RC-IGBT.

Figure 1:
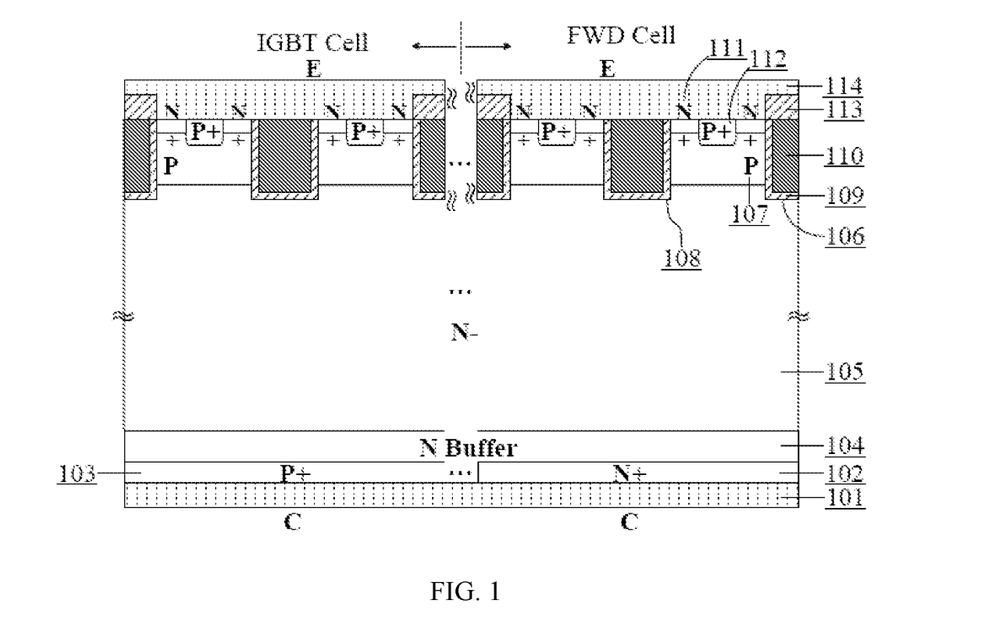
FIG. 1 is a schematic diagram of a cross section of a RC-IGBT device structure with a trench auxiliary gate in the prior art.

From backside structures, RC-IGBT cells may consider heavily doped $P^+$ collector region portion as the IGBT cell and the heavily doped $N^+$ collector region portion as the FWD cell, as shown in FIG. 1. Due to difference in local doping on the back of the RC-IGBT cells, there is snap back when the RC-IGBT cell is forwardly conducted in an IGBT mode, thus the device is prone to local current gathering during operating, which degrades the reliability of the device. In the prior art, the snap back is generally eliminated by adopting a structure that a plurality of IGBT cells are connected in parallel with one FWD cell, while the metal-oxide-semiconductor structure of IGBT (also called MOS structure) is adopted for the frontside structure. To ensure the high breakdown voltage and suppress latch-up effects, the P region in the IGBT frontside structure generally employs a highly doped P-type region. The highly doped P region-type region, as an anode for free-wheeling conduction of the FWD cell, is excessive in hole injection efficiency, which results in excessive reverse recovery loss of the FWD cell during reverse recovery and limits the reduction of overall switching power loss of the device.

To reduce the reverse recovery loss of the FWD cell, there is a solution employing the local lifetime control around the frontside region in the prior art. The specific practice is as follows: near the frontside PN junction, defects are introduced into the local region in a manner of $H^+$ or $He^{2+}$ particle implantation to enhance the carrier recombination process. When the FWD cell is forwardly conducted, the hole injection efficiency can be reduced, and then the number of carries in the drift region before reverse recovery is reduced to achieve the "low" frontside and "high" backside distribution of the carriers. Such carrier distribution can achieve soft and fast characteristics during the reverse recovery of the FWD cell and can reduce the reverse recovery time and reverse recovery charge, which reduces the reverse recovery loss of the RC-IGBT. However, the above technical solution has the problems of large leakage current at high temperature and increased conduction loss under the IGBT mode.

Another solution in the prior art is to independently design the frontside structures of the IGBT cell and FWD cell of the RC-IGBT. The main feature is that the frontside hole injection efficiency of the FWD cell can be individually optimized while the impact on the frontside hole injection efficiency of the IGBT cell is reduced. The specific practice is to employ the existing discrete FWD device frontside structure, such as a self-adjusting P emitter efficiency diode (SPEED) structure. The principle of the technical solution is to introduce a Schottky junction formed by the metal-P-type semiconductor into the frontside P region, which can increase the barrier height for frontside hole injection without changing the process of transporting electrons to the frontside emitter. Such technical solution can change the barrier height of the Schottky junction by changing the doping concentration of the frontside P-type region and work functions of emitter metal, thus adjusting the hole injection efficiency. However, the parameter design using this technology is limited by the RC-IGBT process, leading to limitation on the reduction of reverse recovery loss. A method of controlling by IGBT cell gates is also proposed in the industry, the IGBT cell gates are turned on before the reverse recovery of FWD cell. Then the number of carriers during reverse recovery is reduced by way of deriving the frontside electron currents. However, such solution makes the gate drive control complicated and requires additional device for commutation detection, which is not conducive to controlling the system reliability and cost.

In accordance with the problems in the existing reverse recovery loss reduction techniques for RC-IGBTs, there is a need to provide an innovative device structure to control leakage current and reduce the reverse recovery loss of RC-IGBT without the performance degradation of the IGBT cell, which can satisfy the high reliability requirement for the entire RC-IGBT device in harsh application environments.

SUMMARY

To solve the problems above, the present disclosure provides a power semiconductor device. The device includes a collector electrode located at the bottom. A heavily doped first conductivity type cathode region and a heavily doped second conductivity type collector region are arranged on the collector electrode in a staggered manner. A first conductivity type buffer layer is located on the heavily doped first conductivity type cathode region and a heavily doped collector region. A first conductivity type drift region is located on the first conductivity type buffer layer and an emitter electrode is located at the top of the device. The emitter electrode is spaced from the first conductivity type drift region. More than one frontside structure units are arranged on the first conductivity type drift region. Each of the frontside structure units includes: a trench gate structure, a second conductivity type base region adjacent to the trench gate structure, a lightly doped second conductivity type base region located on one side of the second conductivity type base region to isolate a trench auxiliary gate structure from the second conductivity type base region, the trench auxiliary gate structure, and a floating FP region located at the bottom of the trench auxiliary gate structure. The trench gate structure includes a first gate dielectric layer and a first gate electrode. The floating FP region is separated from the second conductivity type base region and the lightly doped second conductivity type base region. An upper surface of the second conductivity type base region is provided with a first heavily doped first conductivity type emitter region and a heavily doped second conductivity type emitter region. An upper surface of the lightly doped second conductivity type base region is provided with a second heavily doped first conductivity type emitter region. And the first heavily doped first conductivity type emitter region is separated from the second heavily doped first conductivity type emitter region by means of the heavily doped second conductivity type emitter region. An upper surface of the trench gate structure is provided with an insulating dielectric layer for isolating the first gate dielectric layer from the emitter electrode. A second gate electrode, the heavily doped first conductivity type emitter region and the heavily doped second conductivity type emitter region are connected to one another by means of the emitter electrode. And all front structure units are connected to one another by the emitter electrode.

The first heavily doped first conductivity type emitter region, the second heavily doped first conductivity type emitter region, the lightly doped second conductivity type base region and the first conductivity type drift region form a punch-through triode structure.

The second conductivity type base region, the first conductivity type drift region and the floating FP region form a JFET structure.

Further, the heavily doped first conductivity type emitter region has a doping concentration greater than 1e18 cm$^{-3}$, and forms an ohmic contact with the emitter electrode. A punch-through voltage of the triode can be changed to 0.3 V to 1 V by adjusting a junction depth and a doping concentration of the lightly doped second conductivity type base region.

Further, the trench auxiliary gate structure includes a second gate electrode and a second gate dielectric layer. The floating FP region is isolated from the second gate electrode by means of the second gate dielectric layer. And the second gate dielectric layer is isolated from the lightly doped second conductivity type base region by means of the second gate dielectric layer.

Further, the second gate dielectric layer is made of silicon oxide, aluminum oxide, and silicon nitride.

Further, the trench auxiliary gate structure includes the second gate dielectric layer and an emitter electrode partially filled in the trench. The second gate dielectric layer is isolated from the lightly doped second conductivity type base region by means of the second gate dielectric layer. And the upper surface of the floating FP region is in contact with the emitter electrode.

The topography of the trench auxiliary gate structure is inverted trapezoidal. The heavily doped first conductivity type emitter region and the lightly doped second conductivity type base region are arranged on a sidewall of the trench auxiliary gate structure, which extends downwards to be in contact with the floating FP region.

The topography of the trench gate structure is inverted trapezoidal.

Further, a doping concentration of the lightly doped second conductivity type base region is much less than that of each of the second conductivity type base region and the floating FP region, but numerically greater than that of the first conductivity type drift region.

Further, the thickness of the gate dielectric layer is smaller than the width of the gate electrode and is about 0.1 μm to 2 μm. And the gate dielectric layer is made of insulating materials such as silicon dioxide and silicon nitride.

Further, the trench gate structure and the trench auxiliary gate structure have similar depths between 2 μm to 5 μm.

Further, the second conductivity type base region and the floating FP region have the same doping dose and form a Schottky contact with the emitter electrode.

Further, the lateral width of the heavily doped second conductivity type emitter region is smaller than that of the second conductivity type base region. And a ratio of the heavily doped second conductivity type emitter region to the second conductivity type base region is adjustable in the range from 10% to 90%.

Further, the heavily doped second conductivity type emitter region has a depth smaller than 2 μm and is located outside a PN junction depletion region, which is formed by the second conductivity type base region and the first conductivity type drift region.

Further, a N-type channel of the JFET structure formed by the second conductivity type base region, the first conductivity type drift region and the floating FP region has a width between 0.1 μm to 2 μm, such that the JFET channel is completely pinched off when the RC-IGBT is in a blocking state. The JFET channel is formed when the RC-IGBT is forwardly conducted.

Further, the topography of each of the trench gate structure and the trench auxiliary gate structure is inverted trapezoidal. And the sidewalls and bottoms are completely surrounded by the heavily doped first conductivity type emitter region and the floating FP region.

Further, in the same cell, the heavily doped first conductivity type emitter region, the lightly doped second conductivity type base region, the trench auxiliary gate structure and the floating FP region structure are arranged in a staggered manner so as to increase the density of the punch-through NPN triode structure.

Further, the floating FP region has a U-shaped topography and extends upwards to the bottom of the heavily doped first conductivity type emitter region on the upper surface. The topography of the floating FP region is decided by an ion implantation angle and the hot drive-in time.

The present disclosure further provides a fabrication method for the power semiconductor device above. The fabrication method includes the following steps:

Firstly, forming a first conductivity type drift region, and then forming a trench gate structure and a trench auxiliary gate structure on an upper surface of the first conductivity type drift region. Then adjusting the topographies of the trench gate structure and the trench auxiliary gate structure by controlling etching energy, etching time and passivation time.

Secondly, forming a mask layer on the upper surfaces of the trench gate structure and the trench auxiliary gate structure to protect a sidewall of the trench gate structure. Then, forming an ion implantation window, and forming a second conductivity type base region and a floating FP region by means of ion implantation and high temperature drive-in.

wherein the floating FP region has a U-shaped topography. The U-shaped topography is obtained by adjusting an ion implantation angle and the thermal drive-in time. Schottky contacts on left and right sidewalls of the trench auxiliary gate structure are achieved by removing gate dielectric layers on the left and right sidewalls of the trench auxiliary gate structure by means of wet etching when opening the contact region.

Thirdly, forming a gate dielectric layer on inner walls of the trench gate structure and the trench auxiliary gate structure, and then forming a gate electrode.

Fourthly, forming a lightly doped second conductivity type base region between the upper surface of second conductivity type base region (adjacent to the trench gate structure)

and the trench auxiliary gate structure. And then performing ion implantation to form a heavily doped first conductivity type emitter region, wherein a concentration of the lightly doped second conductivity type base region is much less than that of the second conductivity type base region.

Fifthly, forming an ion implantation window of a heavily doped second conductivity type emitter region on the upper surface of the second conductivity type base region. And then performing ion implantation; and forming an insulating dielectric layer on the upper surface of the device wherein forming a contact hole on the surface of the insulating dielectric layer by means of dry etching, and then forming a front emitter electrode by using a metal sputtering process. Or removing the insulating dielectric layer on the surface of the trench auxiliary gate structure, and then removing the gate electrode and the gate dielectric layer filled in the trench auxiliary gate structure in turn until the upper surface of the floating FP region appears. Forming contact holes on the insulating dielectric layer on the surfaces of the heavily doped first conductivity type emitter region and the heavily doped second conductivity type emitter region by means of dry etching. Then forming a front emitter electrode by using a metal sputtering process, filling the inside of the trench auxiliary gate structure until the front emitter electrode is in connected contact with the upper surface of the floating FP region.

Sixthly, processing the backside of the device to form a first conductivity type buffer layer, a heavily doped second conductivity type collector region, a heavily doped first conductivity type cathode region, and a collector.

Specifically, the method includes: thinning the thickness of the back of the device, and then forming a first conductivity buffer layer. Subsequently, performing local ion implantation in turn on the back of the device by using the mask layer to form a heavily doped second conductivity type collector region and a heavily doped first conductivity type cathode region, which is arranged in a staggered manner and to be a collector on the backside of the device.

Compared with the prior art, the present disclosure has the beneficial effects that:

(1) By introducing the punch-through NPN triode to extract front electron currents, the hole injection efficiency of the emitter region when the RC-IGBT is in free-wheeling can be adjusted. Compared with the barrier height adjustment of the Schottky junction and an individual PN junction, the barrier height of the punch-through NPN triode is easy to adjust, and the reduction of reverse recovery loss is easier to achieve.

(2) The barrier height for frontside electron extraction consists of a PN junction depletion region, while there is a JFET structure for shielding a high electric field, which can effectively reduce the leakage current at the high electric field.

(3) The reverse recovery loss reduction effect close to that of the local lifetime control technology can be achieved. And the leakage current, process difficulty and fabrication cost at high temperatures are reduced.

(4) The adjustment of the area and position of punch-through NPN is achieved by changing the density and topography of the frontside trench of the RC-IGBT, which in turn can change the electron extraction and frontside hole injection efficiency. This method increases the design flexibility and design dimension of the device.

(5) The structure is simultaneously suitable for IGBT cells and the FWD cell in the RC-IGBT. It is no need of individual partition design and it can reduce the reverse recovery loss of the RC-IGBT without degrading the characteristics of the RC-IGBT in an IGBT operation mode.

DESCRIPTION OF THE EMBODIMENTS

The present disclosure provides a RC-IGBT device and a preparation method thereof, and provides the following specific embodiments.

It needs to be noted that in the description of the following embodiments, it is considered that a semiconductor substrate of the RC-IGBT is made of a Si material. However, the substrate may also be made of any other materials suitable for the preparation of the device, such as silicon carbide (SiC) and germanium (Ge).

It needs to be noted that corresponding positional words described herein, such as "upper," "lower," "left," "right," "front," and "rear," are relative positions corresponding to those illustrated with reference to drawings. The fixed direction is not limited in the specific implementation, and the frontside structures of the device may consist of a plurality of repeatable units. The following is a description of the minimum front structural unit. In practical implementation, the IGBT cell portion in the frontside structure of the device may be replaced with cell structures of the discrete IGBT in the prior art. The device structure is not limited to silicon-based RC-IGBTs and is also applicable for silicon-based field effect transistors (MOSFET), silicon carbide-based MOSFETs, and silicon carbide-based RC-IGBTs.

Embodiment 1

Figure 2:
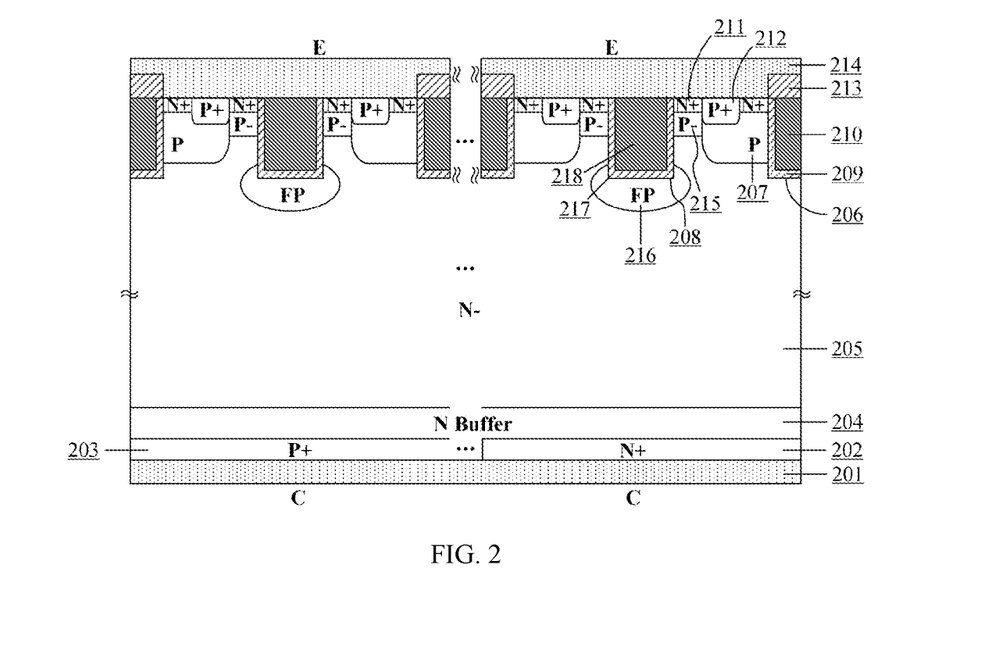
FIG. 2 is a schematic diagram of a cross section of a RC-IGBT device structure in accordance with a first embodiment of the present disclosure.

FIG. 2 is a schematic diagram of a cross section of a RC-IGBT device in accordance with a first embodiment of the present disclosure. The device structure includes: a collector electrode 201 located at the bottom, a heavily doped $N^+$ cathode region 202 and a heavily doped $P^+$ collector region 203 which are located on the collector region 201 in a staggered manner. A N-type buffer layer 204 is located on the heavily doped $N^+$ cathode region 202 and the heavily doped $P^+$ collector region 203. And a N-type drift region 205 is located on the N-type buffer layer 204. An upper surface of the N-type drift region 205 consists of a plurality of repeating type frontside structures. The minimum front structural unit includes: a trench gate structure 206, a P-type base region 207, a trench auxiliary gate structure 208, a lightly doped P⁻-type base region 215, and a floating FP region 216. The trench gate structure 206 is sequentially filled with a first gate dielectric layer 209 and a first gate electrode 210. The P-type base region 207 is adjacent to the trench gate structure 206 and is isolated from the first gate electrode 210 by means of the first gate dielectric layer 209. The trench auxiliary gate structure 208 is sequentially formed by a second gate dielectric layer 217 and a second gate electrode 218. And it is isolated from the P-type base region 207 by means of a lightly doped P⁻-type base region 215. The floating FP region 216 is located at the bottom of the trench auxiliary gate structure 208. And it is isolated from the second gate electrode 218 in the trench auxiliary gate structure 208 by means of the second gate dielectric layer 217 which is isolated from the P-type base region 207 and the lightly doped P⁻-type base region 215 by means of the N-type drift region 205. An upper surfaces of the P-type base region 207 and the lightly doped P⁻-type base region 215 are both provided with heavily doped N⁺-type emitter regions 211. The heavily doped N⁺-type emitter regions 211 are separated by a heavily doped P⁺-type emitter region 212 on the upper surface of the P-type base region 207. An upper surface of the trench gate structure 206 is provided with an insulating dielectric layer 213. The insulating dielectric layer 213 is configured to isolate an emitter electrode 214 from the gate electrode 210 in the trench gate structure 206. A second gate electrode 210 in the trench auxiliary gate structure 208, the heavily doped N⁺-type emitter regions 211 and the heavily doped P⁺-type emitter region 212 are connected to one another by means of the emitter electrode 214. The plurality of repeating type frontside structures are connected to one another by means of the emitter electrode 214. Particularly, the heavily doped N⁺-type emitter region 211, the lightly doped P⁻-type base region 215 and the N-type drift region 205 form a punch-through NPN triode structure. The P-type base region 207, the N-type drift region 205 and the floating FP region 216 form a JFET structure.

The heavily doped N⁺-type emitter region 211 has a doping concentration greater than $1e18$ cm$^{-3}$ and forms an ohmic contact with the emitter electrode 214. A punch-through voltage of the NPN triode is changed to 0.3 V to 1 V by adjusting a junction depth and a doping concentration of the lightly doped P⁻-type base region 215.

The doping concentration of the lightly doped P⁻-type base region 215 is much less than that of each of the P-type base region 207 and the floating FP region 216. but numerically greater than that of the N-type drift region 205. The thickness of the gate dielectric layer 209 is smaller than the width of the gate electrode 210 and is about 0.1 μm to 2 μm. The gate dielectric layer is made of insulating materials such as silicon dioxide and silicon nitride. The trench gate structure 206 and the trench auxiliary gate structure 208 have similar depths between 2 μm to 5 μm.

The P-type base region 207 and the floating FP region 216 have the same doping dose and form a Schottky contact with the emitter electrode 214. The heavily doped Pt-type emitter region 212 has a doping concentration greater than $1e18$ cm$^{-3}$ and forms an ohmic contact with the emitter electrode 214. A lateral width of the heavily doped Pt-type emitter region 212 is less than that of the P-type base region 207. A ratio of the heavily doped second conductivity type emitter region to the second conductivity type base region is adjustable in the range from 10% to 90%. Further, the heavily doped Pt-type emitter region 212 has a depth less than 2 μm and is located outside a PN junction depletion region formed by the P-type base region 207 and the N-type drift region 205. A N-type channel of the JFET structure formed by P-type base region 207, the N-type drift region 205 and the floating FP region 216 has a width between 0.1 μm to 2 μm, such that the JFET channel is completely pinched off when the RC-IGBT is in a blocking state. The JFET channel is formed when the RC-IGBT is forwardly conducted.

In the same cell, the heavily doped N⁺-type emitter region 211, the lightly doped P⁻-type base region 215, the trench auxiliary gate structure 208 and the floating FP region structure 216 are arranged in a staggered manner so as to increase the density of the punch-through NPN triode structure.

Figure 3:
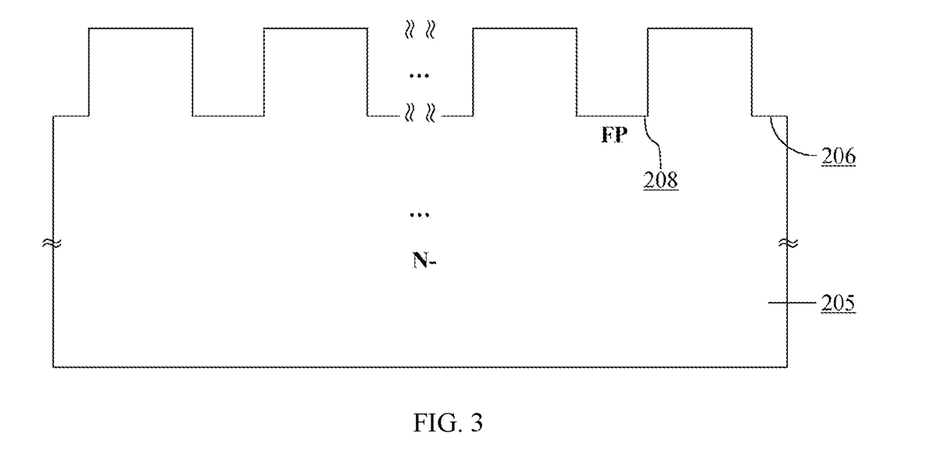
FIG. 3 to FIG. 8 are schematic diagrams of cross sections of main fabrication steps in accordance with a first embodiment of the present disclosure.

In addition, the present disclosure further provides a fabrication method for the device of the first embodiment, as shown in FIGS. 3-8:

Firstly, a N-type drift region 205 is formed. A mask layer is formed on an upper surface of the N-type drift region 205. And a vertical type trench gate structure 206 and a trench auxiliary gate structure 208 are formed by means of dry etching, wherein the trench has a depth of 2 μm to 5 μm, as shown in FIG. 3.

Figure 4:
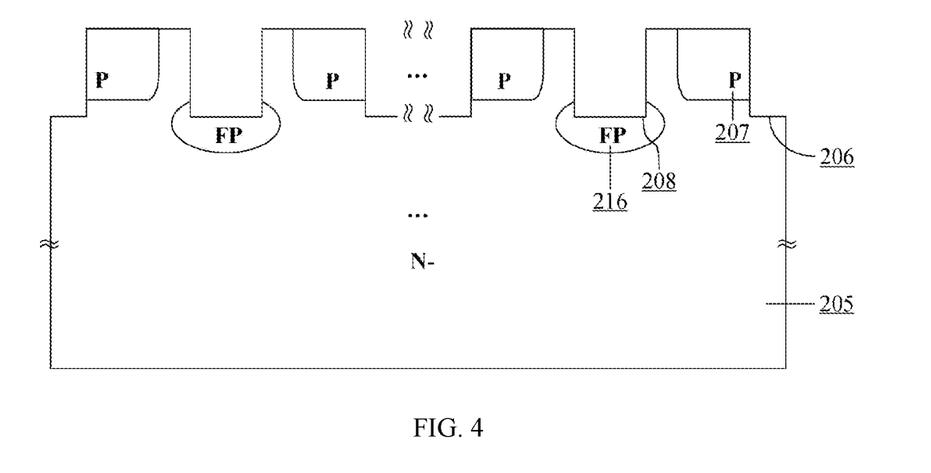

Secondly, as shown in FIG. 4, a mask layer is formed on the upper surfaces of the trench gate structure 206 and the trench auxiliary gate structure 208 to protect a sidewall of the trench gate structure. Meanwhile, an ion implantation window is formed, and a P-type base region 207 and a floating FP region 216 are formed by means of ion implantation and high-temperature drive-in. A commonly used impurity for P-type implantation is boron.

Figure 5:
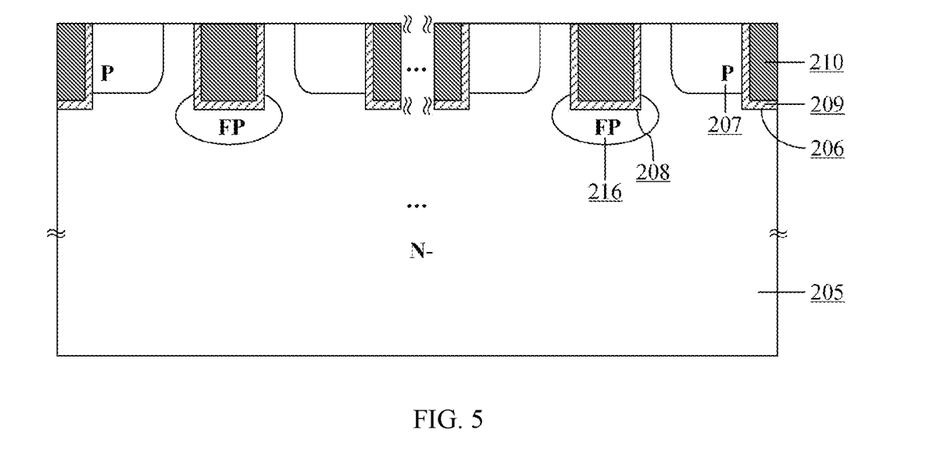

Thirdly, as shown in FIG. 5, a gate dielectric layer, which may be made of silicon oxide, aluminum oxide and silicon nitride, is formed on the inner walls of the trench gate structure 206 and the trench auxiliary gate structure 208 by using a high temperature thermal growth or chemical vapor deposition process. Then a gate electrode, which may be made of heavily doped polycrystalline silicon, is formed by using the chemical vapor deposition process.

Figure 6:
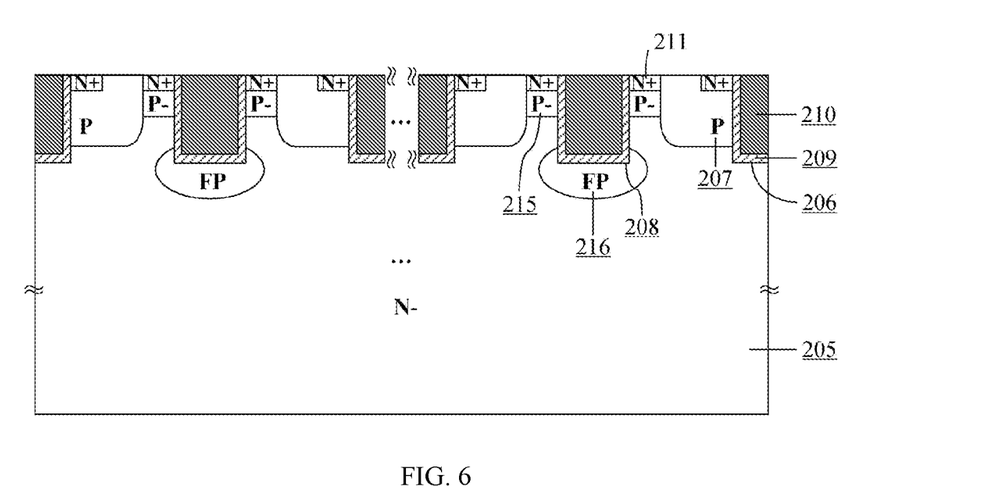

Fourthly, as shown in FIG. 6, an ion implantation window of a punch-through NPN triode is formed between the P-type base region 207 and the trench auxiliary gate structure 208 as well as the upper surface of the P-type base region 207 adjacent to the trench gate structure 206. The P-type ion implantation and high-temperature drive-in process are performed firstly to form a lightly doped P⁻-type base region 215. A commonly used impurity for P-type implantation is boron. Then N-type ion implantation is performed to form a heavily doped N⁺-type emitter region 211. A commonly used impurity for N-type implantation is arsenic. The concentration of the lightly doped P⁻-type base region 215 is much less than that of the P-type base region 207. Then, the change in the doping concentrations of the P-type base region 207 and the heavily doped N⁺-type emitter region 211 is negligible.

Figure 7:
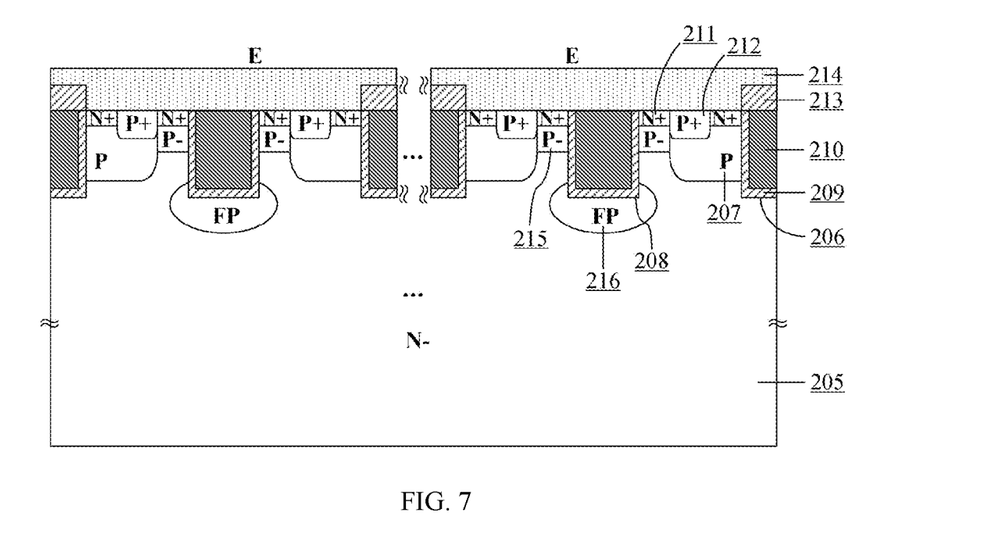

Fifthly, as shown in FIG. 7, an ion implantation window of a heavily doped P⁺-type emitter region 212 is formed on the upper surface of the P-type base region 207 by dry-etching the mask layer, and then P-type ion implantation is performed. A commonly used impurity for P-type implantation is boron. An insulating dielectric layer 213 is formed on the upper surface of the device by using a high temperature thermal growth or chemical vapor deposition process. A contact hole is formed on the surface of the insulating dielectric layer 213 by means of dry etching, and then a front emitter electrode 214 is formed by using a metal sputtering process.

Figure 8:
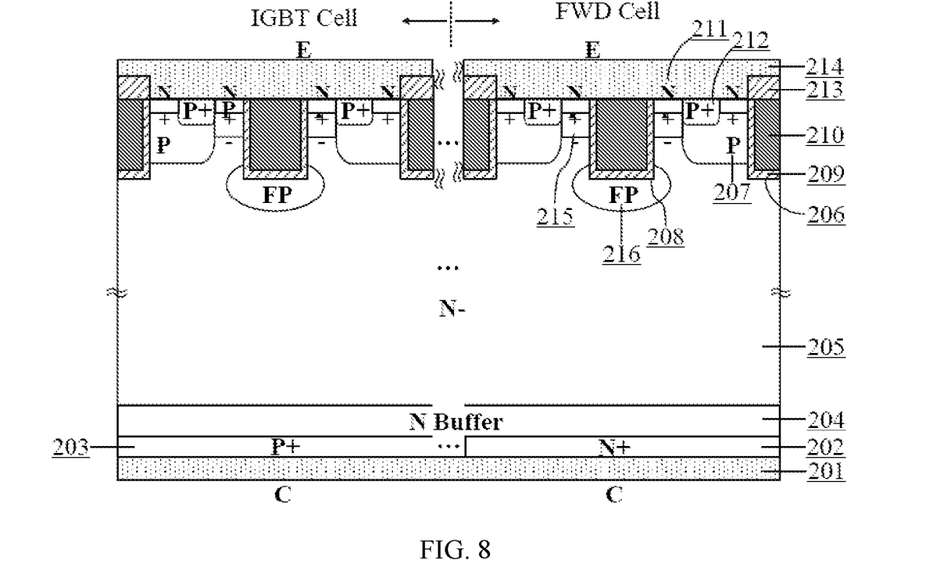

Finally, as shown in FIG. 8, the back thickness of the device is thinned by using a thinning process. Then a N-type buffer layer 204 is formed by a N-type impurity diffusion or ion implantation process. Subsequently, local P-type ion implantation and local N-type ion implantation are performed in sequence on the back of the device by using the mask layer to form a heavily doped P+ collector region 203 and a heavily doped 1\1+ cathode region 202, which is arranged in a staggered manner. Finally, a backside collector electrode 201 is formed by using the metal sputtering process.

Embodiment 2

Figure 9:
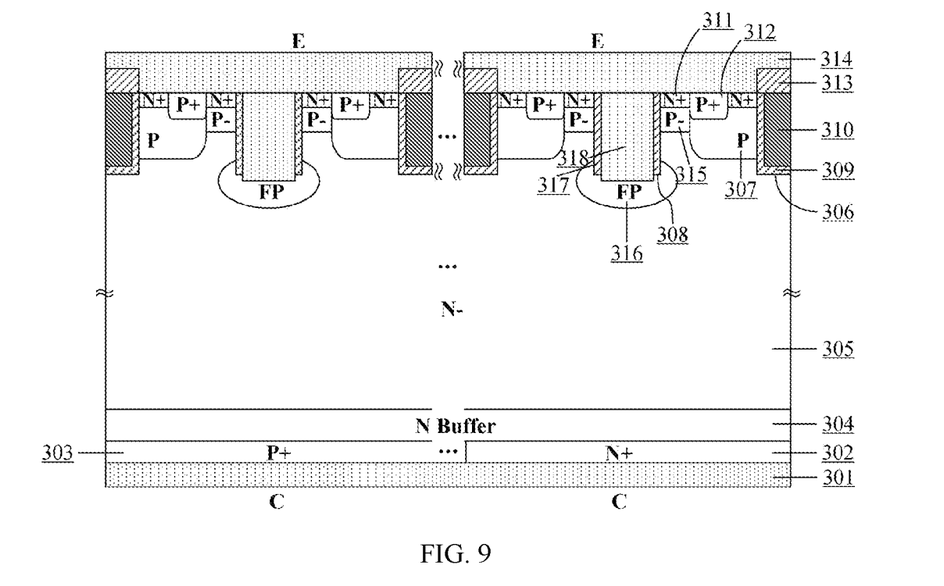
FIG. 9 is a schematic diagram of a cross section of a RC-IGBT device structure in accordance with a second embodiment of the present disclosure.

FIG. 9 is a schematic diagram of a cross section of a RC-IGBT device in accordance with a second embodiment of the present disclosure. Compared with the device structure in the first embodiment shown in FIG. 2, the difference of the device structure in the second embodiment is that an upper surface of a floating FP region 316 is directly connected to an emitter electrode 314 at the bottom of a trench auxiliary gate structure 308. While in the first embodiment of FIG. 2, a Schottky contact is formed between the floating FP region 216 and the emitter electrode 214. In the second embodiment, such design increases the area and hole pathways of the frontside emitter region of the RC-IGBT. And the Schottky contact may control the hole injection efficiency. This design is conducive to reducing on-state voltage drop and reverse recovery loss of the device.

The device structure consists of: a collector electrode 301 located at the bottom, a heavily doped N+ cathode region 302 and a heavily doped P+ collector region 303 located on the collector region 301 in a staggered manner, a N-type buffer layer 304 located on the heavily doped N+ cathode region 302 and the heavily doped P+ collector region 303, and a N-type drift region 305 located on the N-type buffer layer 304. An upper surface of the N-type drift region 305 consists of a plurality of repeating type frontside structures. The minimum front structural unit includes: a trench gate structure 306, a P-type base region 307, a trench auxiliary gate structure 308, a lightly doped P−-type base region 315, and a floating FP region 316. The trench gate structure 306 is sequentially filled with a first gate dielectric layer 309 and a first gate electrode 310. The P-type base region 307 is adjacent to the trench gate structure 306 and is isolated from the first gate electrode 310 by means of the gate dielectric layer 309. The trench auxiliary gate structure 308 is sequentially formed by a second gate dielectric layer 317 and an emitter electrode 318 partially filled in the trench, which is isolated from the P-type base region 307 by means of a lightly doped P−-type base region 315. An emitter electrode 314 in the trench auxiliary gate structure 308 is isolated from the lightly doped P−-type base region 315 by means of the second gate dielectric layer 309. The floating FP region 316 is located at the bottom of the trench auxiliary gate structure 308 and is directly connected to the emitter electrode 314 at the bottom of the trench auxiliary gate structure 308. The floating FP region is also isolated from the emitter electrode 314 on the sidewall of the trench auxiliary gate structure 308 by means of the gate dielectric layer 309. The floating FP region 316 is separated from the P-type base region 307 and the lightly doped P−-type base region 315 by means of the N-type drift region 305. Upper surfaces of the P-type base region 307 and the lightly doped P−-type base region 315 are both provided with heavily doped N+-type emitter regions 311. The heavily doped N+-type emitter regions 311 are separated by a heavily doped Pt-type emitter region 312 on the upper surface of the P-type base region 307. An upper surface of the trench gate structure 306 is provided with an insulating dielectric layer 313. And the insulating dielectric layer 313 is configured to isolate the emitter electrode 314 from the first gate electrode 310 in the trench gate structure 306. The emitter electrode 314 in the trench auxiliary gate structure 308, the heavily doped N+-type emitter region 311 and the heavily doped P+-type emitter region 312 are connected to one another by means of the emitter electrodes 314 on the upper surface of the device. The plurality of repeating type frontside structures are connected to one another by means of the emitter electrodes 314. Particularly, the heavily doped N+-type emitter region 311, the lightly doped P−-type base region 315 and the N-type drift region 305 form a punch-through NPN triode structure. The P-type base region 307, the N-type drift region 305 and the floating FP region 316 form a JFET structure.

The main operating principle and other key structural parameters of the device are consistent with those of the device in the first embodiment. As such, necessary details will not be repeated here.

In addition, the present disclosure further provides a fabrication method for the device of the second embodiment, as shown in FIGS. 10-17.

Figure 10:
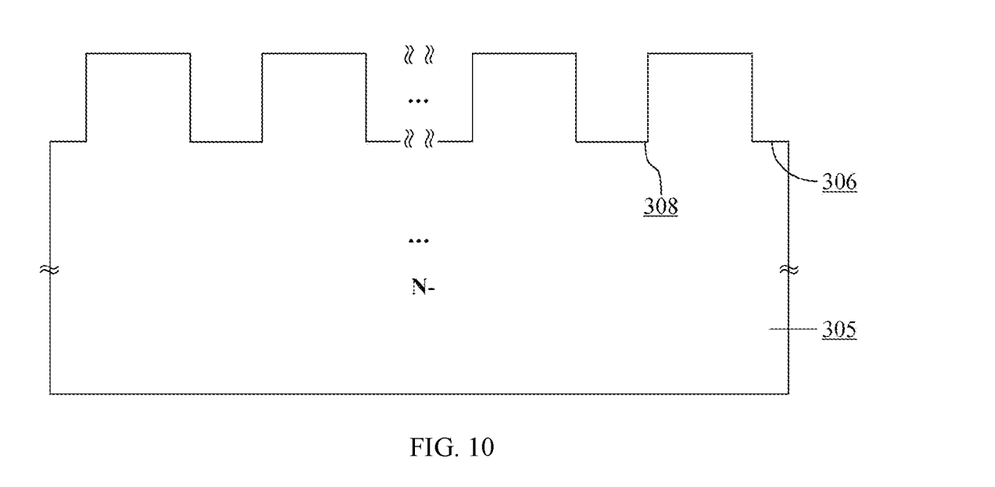
FIG. 10 to FIG. 17 are schematic diagrams of cross sections of main fabrication steps in accordance with a second embodiment of the present disclosure.

Firstly, a N-type drift region 305 is formed. A mask layer is formed on an upper surface of N-type drift region 305. And a vertical type trench gate structure 306 and a trench auxiliary gate structure 308 are formed by means of dry etching, where the trench has a depth of 2 μm to 5 μm, as shown in FIG. 10.

Figure 11:
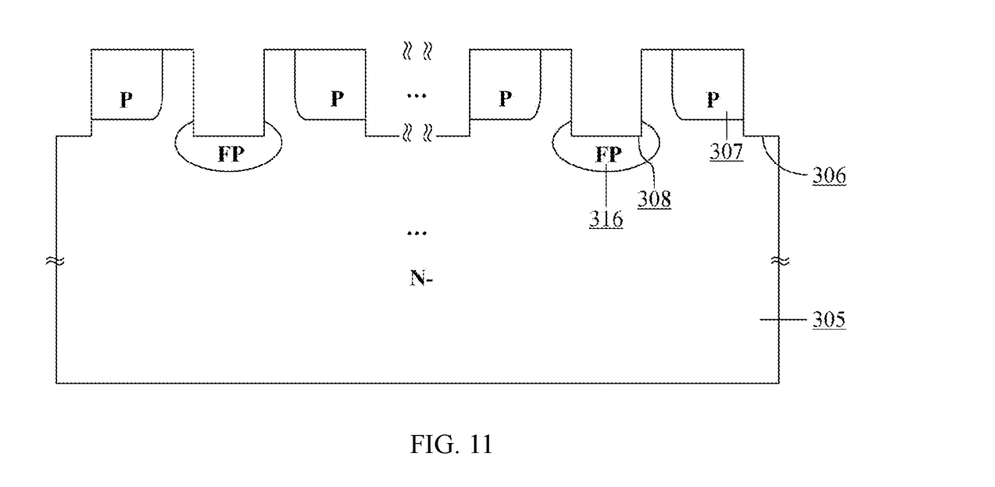

Secondly, as shown in FIG. 11, mask layer is formed on the upper surfaces of the trench gate structure 306 and the trench auxiliary gate structure 308, which can protect a sidewall of the trench gate structure. Meanwhile, an ion implantation window is formed. A P-type base region 307 and a floating FP region 316 are formed by means of ion implantation and high-temperature drive-in process. A commonly used impurity for P-type implantation is boron.

Figure 12:
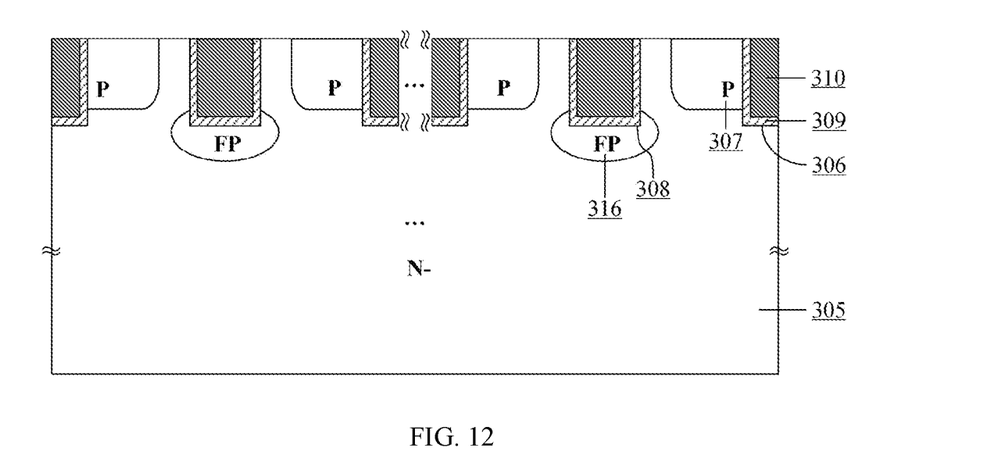

Thirdly, as shown in FIG. 12, a gate dielectric layer, which may be made of silicon oxide, aluminum oxide and silicon nitride, is formed on the inner walls of the trench gate structure 306 and the trench auxiliary gate structure 308 by using a high temperature thermal growth or chemical vapor deposition process. Then a second gate dielectric layer 317 and an emitter electrode 318 partially filled in the trench are formed by the chemical vapor deposition process, wherein the gate electrode may be made of heavily doped polycrystalline silicon.

Figure 13:
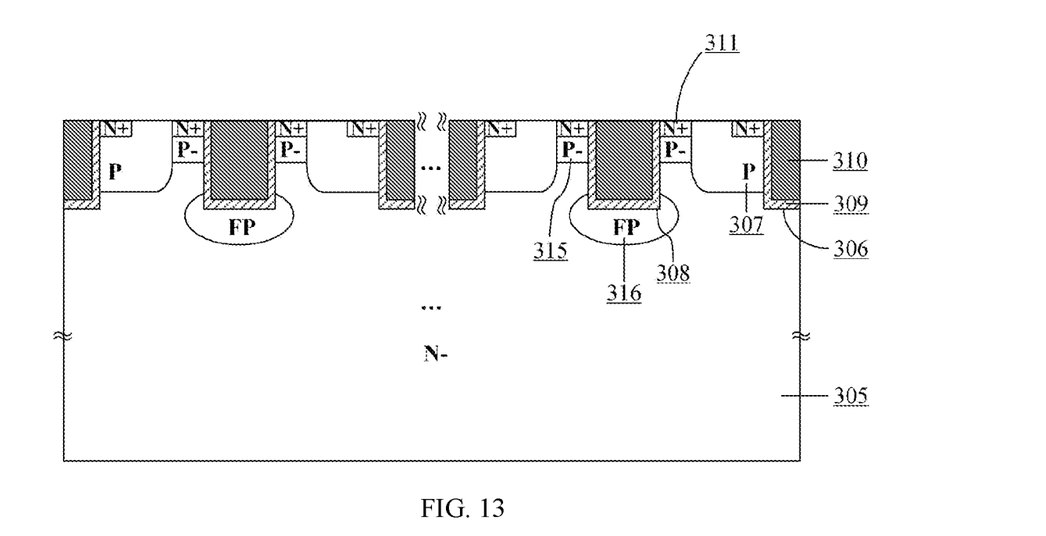

Fourthly, as shown in FIG. 13, an ion implantation window of a punch-through NPN triode is formed between the P-type base region 307 and the trench auxiliary gate structure 308 as well as the upper surface of the P-type base region 307 adjacent to the trench gate structure 306. The P-type ion implantation and high-temperature drive-in are performed firstly to form a lightly doped P−-type base region 315. A commonly used impurity for P-type implantation is boron. Then N-type ion implantation is performed to form a heavily doped N+-type emitter region 311. A commonly used impurity for N-type implantation is arsenic. The concentration of the lightly doped P−-type base region 315 is much less than that of the P-type base region 307. Therefore, the change in the doping concentrations of the P-type base region 307 and the heavily doped N+-type emitter region 311 is negligible.

Figure 14:
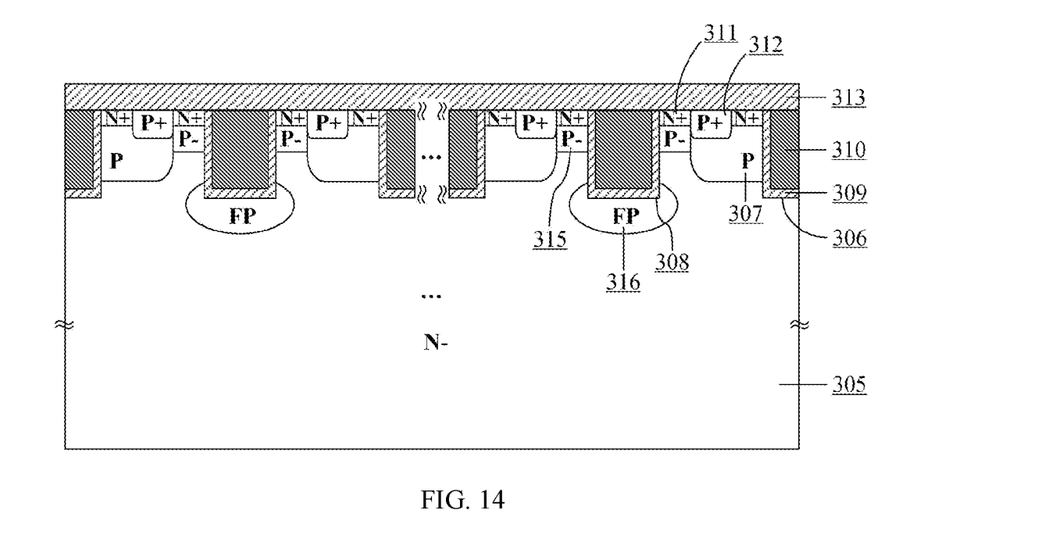

Fifthly, as shown in FIG. 14, an ion implantation window of the heavily doped P$^+$-type emitter region 312 is formed on the upper surface of the P-type base region 307 by dry-etching the mask layer. Then the P-type ion implantation is performed. A commonly used impurity for P-type implantation ion is boron. Then, an insulating dielectric layer 313 is formed on the upper surface of the device by using a high temperature thermal growth or chemical vapor deposition process.

Figure 15:
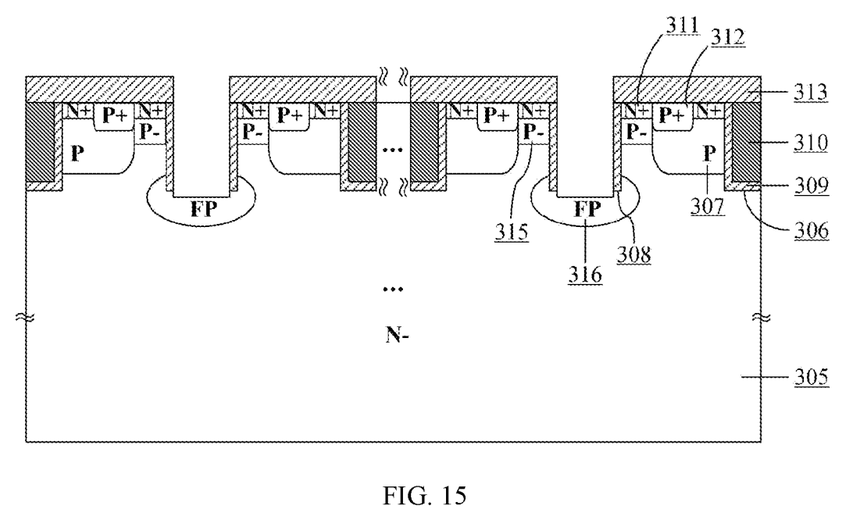

Sixthly, as shown in FIG. 15, the insulating dielectric layer 313 on the surface of the trench auxiliary gate structure 308 is removed by means of dry etching. Then the second gate dielectric layer 317 filled in the trench auxiliary gate structure 308 and the emitter electrode 318 partially filled in the trench are removed successively by means of dry etching or wet etching until an upper surface of the floating FP region 316 appears.

Figure 16:
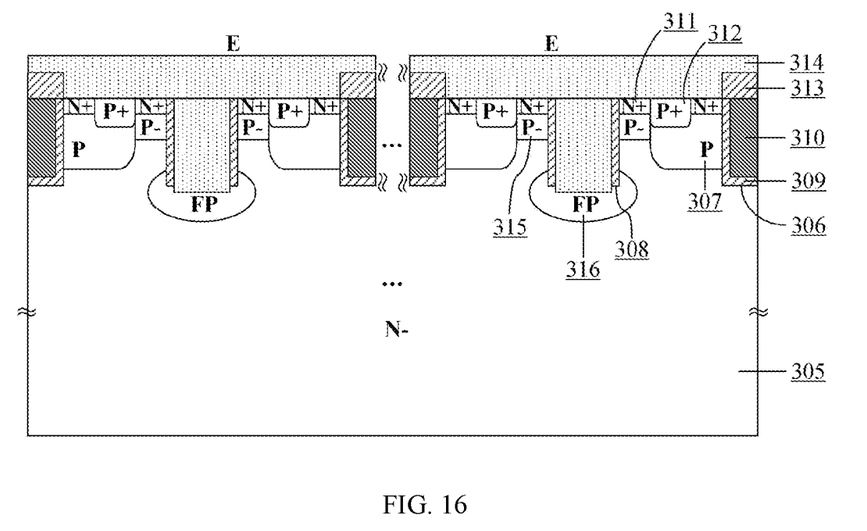

Seventhly, as shown in FIG. 16, a contact hole is formed on the insulating dielectric layer 313 on the surfaces of the heavily doped N$^+$-type emitter region 311 and the heavily doped Pt-type emitter region 312 by means of dry etching. Then a frontside emitter electrode 314 is formed by using a metal sputtering process. The frontside emitter electrode is configured to fill the inside of the trench auxiliary gate structure 308 until the front emitter electrode 314 is in interconnected contact with the upper surface of the floating FP region 316.

Figure 17:
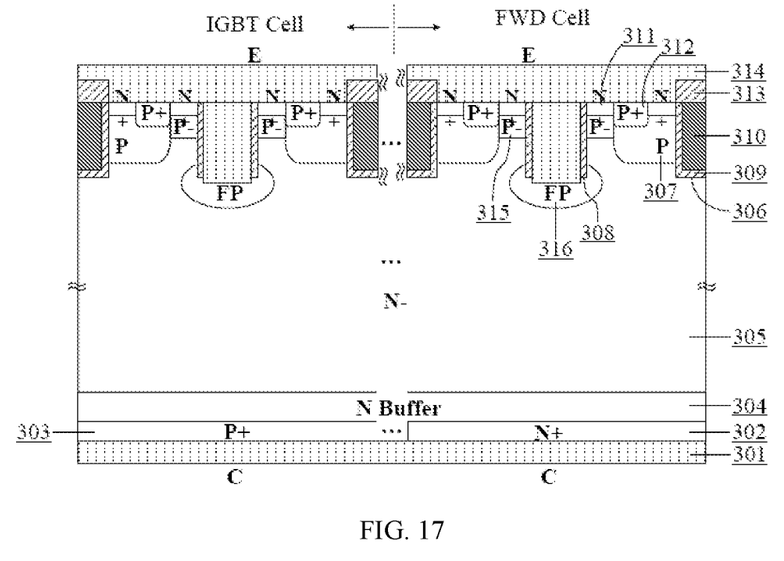

Finally, as shown in FIG. 17, the backside thickness of the device is thinned by using a thinning process. Then a N-type buffer layer 304 is formed by a N-type impurity diffusion or ion implantation process. Subsequently, a local P-type ion implantation and local N-type ion implantation are performed in sequence on the backside of the device by using the mask layer to form a heavily doped P$^+$ collector region 303 and a heavily doped N$^+$ cathode region 302 arranged in a staggered manner. Finally, a backside collector electrode 301 is formed by using the metal sputtering process.

Embodiment 3

Figure 18:
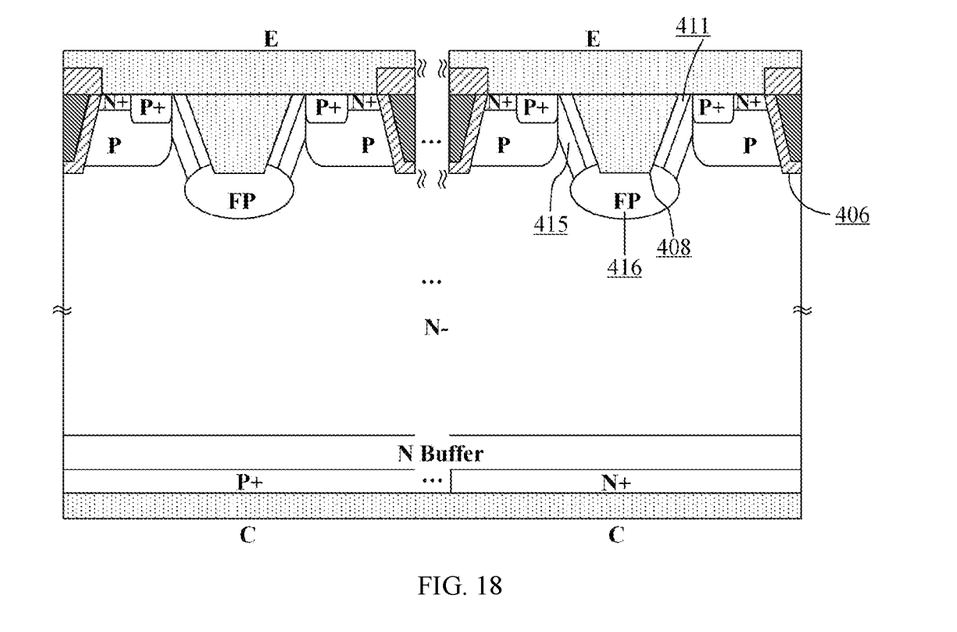
FIG. 18 is a schematic diagram of a cross section of a RC-IGBT device structure in accordance with a third embodiment of the present disclosure.

FIG. 18 is a schematic diagram of a cross section of a cell structure of a RC-IGB device in accordance with a third embodiment of the present disclosure. Compared with the device structure of the second embodiment of the present disclosure, the device structure of the third embodiment further has the following features: the topography of each of a trench gate structure 406 and a trench auxiliary gate structure 408 is inverted trapezoidal. A lightly doped P$^-$-type base region 415 and a heavily doped N$^+$-type emitter region 411 on the surface thereof are both located on the left and right sidewalls of a trench auxiliary gate structure 408. Such design increases the area of the left and right sidewalls of the trench auxiliary gate structure as the frontside emitter region as well as the conductive area. Therefore, it is conducive to improving an area ratio of the punch-through NPN triode structure on the front, which can enhance the extraction of electrons by the frontside FWD cell and reduce the reverse recovery loss. For the fabrication method, the topography control of the trench gate structure 406 and the trench auxiliary gate structure 408 is achieved by controlling etching energy, etching time and passivation time by using a Bosch process. The punch-through NPN triode structure located on the left and right sidewalls of the trench auxiliary gate structure 408 can be achieved by removing the gate dielectric layer on the left and right sidewalls of the trench auxiliary gate structure 408 using wet etching when opening the contact region.

Embodiment 4

Figure 19:
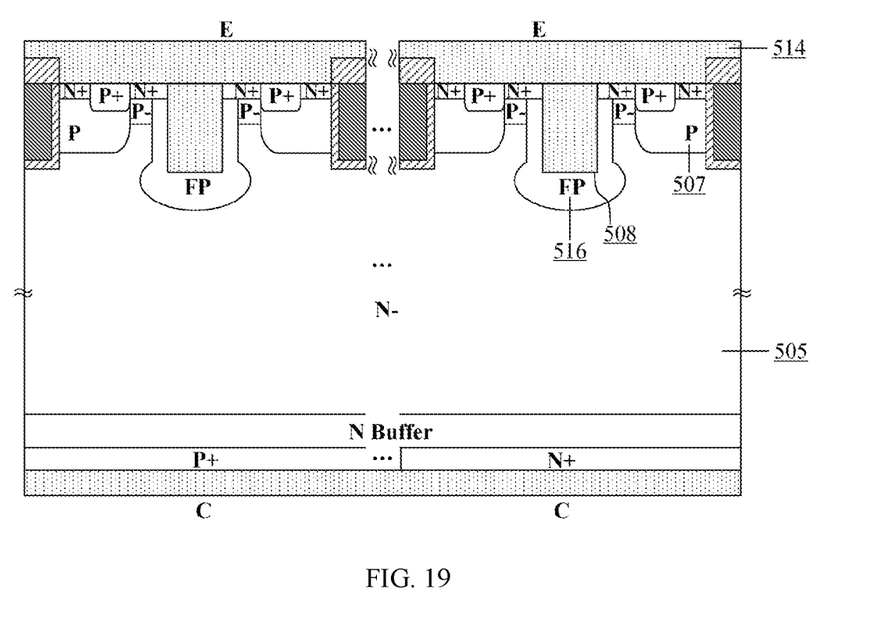
FIG. 19 is a schematic diagram of a cross section of a RC-IGBT device structure in accordance with a fourth embodiment of the present disclosure.

FIG. 19 is a schematic diagram of a cross section of cell structures of a RC-IGBT device in accordance with a fourth embodiment of the present disclosure. Compared with the device structure of the second embodiment of the present disclosure, the device structure of the fourth embodiment further has the following features: a floating FP region 516 has a U-shaped topography. The left and right sidewalls and the bottom of a trench auxiliary gate structure 508 are completely surrounded and are all connected with an emitter electrode 514 to form Schottky contacts. And an electron channel of a JFET structure formed by a P-type base region 507, a N-type drift region 505 and the floating FP region 516 is narrower. Such design increases the shielding effect of the JFET structure against high electric fields when the RC-IGBT is in a blocking state, which is conducive to reducing the leakage current. Meanwhile, the left and right sidewalls of the trench auxiliary gate structure 508 are conductive area of the emitter region, especially the conductive area of the hole, which is conducive to reducing the voltage drop when the RC-IGBT is forwardly conducted.

For the fabrication method, the U-shaped topography of the floating FP region 516 is controlled by an ion implantation angle and thermal drive-in time. The Schottky contacts on the left and right sidewalls of the trench auxiliary gate structure 508 are achieved by removing the gate dielectric layer 509 on the left and right sidewalls of the trench auxiliary gate structure 508 using wet etching when opening the contact region.

The operating principle of the semiconductor device of the present disclosure is explained as follows:

Taking the RC-IGBT as an example, when the RC-IGBT is conducted for freewheeling, i.e., a gate voltage is less than zero, an emitter-to-collector voltage Vec is higher than on-state voltage drop, FWD cell in the RC-IGBT is in a small current-on state. There is hole injection in the front of the IGBT cell, and corresponding back is almost non-conductive. In accordance with an existing RC-IGBT device structure shown in FIG. 1, to guarantee the breakdown voltage of the IGBT cell portion and suppress the latch-up effect, the P region in the frontside structure is typically heavily doped and the hole injection efficiency at the moment is too high, resulting in increased loss of the FWD cell in subsequent reverse recovery process.

The punch-through NPN triode of the proposed structure has a classical punch-through voltage drop value of 0.7 V. The hole injection in the frontside structure at the moment mainly involves the heavily doped Pt-type emitter region, the P-type base region and the floating FP region. Further, when the floating FP region is in contact with the emitter electrode, the floating FP region and the P-type base region may both form Schottky contact with the emitter electrode due to work function difference of materials. The polarity characteristics of the Schottky junction make the voltage drop be partially distributed to both ends of the Schottky junction, such that the potential of the P-type base region and the floating FP region is reduced. Then, in turn the hole injection efficiency decreases. The formed Schottky junction has no effect on the diffusion of electrons from the P-type region to the emitter electrode. Compared with the FWD cell structure in the existing RC-IGBT, the punch-through NPN triode structure for electron extraction in the drift region is introduced into the proposed structure, thus the frontside hole injection efficiency can be reduced. And hole currents of emitters can be converted into electron drift currents without significantly increasing on-state voltage drop. At the punch through state of the punch-through NPN triode in the proposed structure, the electric field intensity of the lightly doped P⁻-type base region of the NPN is greater than 1e4 V/cm, where electrons are close to reaching velocity saturation. The carrier velocity overshoot may occur when the junction depth of the lightly doped P-type base region is shallow. At the moment, the electrons close to the frontside position of the drift region are transported to the emitter electrode at a saturation velocity due to high electric fields of the lightly doped P⁻-type base region of the NPN. Therefore, more hole currents from emitters are converted into the electron drift currents. Then, the hole injection and the number of carriers in the drift region are reduced. In turn, when the device is conducted at low currents, the carrier distribution are low in the front and high in the back across the drift region.

When the FWD cells of the proposed structure enter the reverse recovery, i.e., the gate voltage is less than zero, and the emitter-to-collector voltage Vec gradually decreases to zero and reverse conduction is started. The carriers in the drift region has the distribution profile that the frontside carrier concentration is low while the overall number is reduced. Then the reverse recovery charge is reduced and a PN junction depletion region in the drift region can be rapidly broadened to sweep out the carriers to withstand the blocking voltage, which reduces the reverse recovery time. The carriers in the drift region have the distribution profile that the backside carrier concentration is high. Then the current may have enough carriers to achieve free-wheeling at the tail current stage, which can avoid the sudden decrease of reverse recovery current and suppress the generation of EMI noise.

When the RC-IGBT device is in a blocking state, i.e., the gate voltage is less than zero, and the emitter-to-collector voltage Vec is less than zero. The JFET structure formed by the P-type base region and the floating FP region with the N-type drift region, or the adjacent floating FP regions with the N-type drift region, may pinch off the JFET channel region. Then the effect of the high electric fields on the punch-through NPN triode is shielded. Meanwhile, during punch through, the depletion region is a PN junction, which is more insensitive to the high electric fields and high temperatures and cannot increase the leakage current significantly. The proposed RC-IGBT structure utilizes the trench auxiliary gate structure in the prior art. It also introduces the floating FP region and the punch-through NPN triode structure, which is compatible with an existing RC-IGBT process without affecting the switching process of the IGBT cell portion of the RC-IGBT.

Further, when the position of the punch-through NPN triode is adjusted to the sidewall of the inverted-trapezoidal trench auxiliary gate structure, or the floating FP region has a U-shaped topography, the conductive area of the emitter region and the electron extraction capacity of the punch-through NPN triode are effectively increased, which is conducive to reducing the on-state voltage drop and improving the forward surge current capacity of the device. With the increase of the density of the trench gate, the punch-through NPN triode has an increased area for frontside electron extraction, which is more conducive to reducing frontside carrier distribution in the drift region and further reducing the reverse recovery loss of the RC-IGBT.

What is claimed is:

1. A power semiconductor device, comprising a collector located at the bottom, a heavily doped first conductivity type cathode region and a heavily doped second conductivity type collector region arranged on the collector in a staggered manner, a first conductivity type buffer layer located on the heavily doped first conductivity type cathode region and a heavily doped collector region, a first conductivity type drift region located on the first conductivity type buffer layer, and an emitter electrode located on the top of the device, the emitter electrode is separated from the first conductivity type drift region, wherein more than one frontside structure units are arranged on the first conductivity type drift region, each of the frontside structure units comprises: a trench gate structure, a second conductivity type base region adjacent to the trench gate structure, a lightly doped second conductivity type base region located on one side of the second conductivity type base region to isolate a trench auxiliary gate structure from the second conductivity type base region, the trench auxiliary gate structure, and a floating FP region located at the bottom of the trench auxiliary gate structure; the trench gate structure comprises a first gate dielectric layer and a first gate electrode; the floating FP region is separated from the second conductivity type base region and the lightly doped second conductivity type base region; an upper surface of the second conductivity type base region is provided with a first heavily doped first conductivity type emitter region and a heavily doped second conductivity type emitter region, an upper surface of the lightly doped second conductivity type base region is provided with a second heavily doped first conductivity type emitter region, and the first heavily doped first conductivity type emitter region is separated from the second heavily doped first conductivity type emitter region; an upper surface of the trench gate structure is provided with an insulated dielectric layer for isolating the first gate dielectric layer from the emitter electrode, a second gate electrode is arranged in the trench auxiliary gate structure, the second gate electrode, the heavily doped first conductivity type emitter region and the heavily doped second conductivity type emitter region are connected to one another by means of the emitter electrode, and all frontside structure units are connected to one another by the emitter electrode; the second heavily doped first conductivity type emitter region, the lightly doped second conductivity type base region and the first conductivity type drift region form a punch-through triode structure, the second conductivity type base region, the first conductivity type drift region and the floating FP region form a JFET structure;

the second conductivity type base region and the floating FP region have the same doping dose, and the second conductivity type base region and the floating FP region form a Schottky contact with the emitter electrode;

the second gate electrode is formed by the emitter electrode filled in the trench, and an upper surface of the floating FP region is directly connected to the emitter electrode at the bottom of the trench auxiliary gate structure; and the topography of the trench gate structure and the trench auxiliary gate structure is inverted trapezoidal, the lightly doped second conductivity type base region and the second heavily doped first conductivity type emitter region on the surface thereof are both located on left and right sidewalls of the trench auxiliary gate structure.

2. The power semiconductor device according to claim 1, wherein the heavily doped first conductivity type emitter region has a doping concentration greater than $1e18$ cm$^{-3}$, and it forms an ohmic contact with the emitter electrode; and by adjusting a junction depth and a doping concentration of the lightly doped second conductivity type base region, a punch-through voltage of the triode structure is changed to be 0.3 V to 1 V.

3. A fabrication method for the power semiconductor device according to claim 1, comprising the following steps:
firstly, forming a first conductivity type drift region, and forming a trench gate structure and a trench auxiliary gate structure on an upper surface of the first conductivity type drift region;
secondly, forming a mask layer on the surfaces of the trench gate structure and the trench auxiliary gate structure so as to protect a sidewall of the trench gate structure, forming an ion implantation window at the same time, and then forming a second conductivity type base region and a floating FP region by means of ion implantation and thermal drive-in, the temperature for high temperature drive-in is 900° C. to 1200° C.;
thirdly, forming a gate dielectric layer on inner walls of the trench gate structure and the trench auxiliary gate structure, and then forming gate electrodes;
fourthly, forming an ion implantation window of a punch-through triode between the second conductivity type base region and the trench auxiliary gate structure as well as the upper surface of the second conductivity type base region adjacent to the trench gate structure; performing second conductivity type ion implantation to form a lightly doped second conductivity type base region, and then performing first conductivity type ion implantation to form a heavily doped first conductivity type emitter region;
fifthly, forming an ion implantation window of a heavily doped second conductivity type emitter region on the upper surface of the second conductivity type base region, and then performing ion implantation; forming an insulated dielectric layer, and finally forming a frontside emitter electrode on the upper surface of the device;
sixthly, processing the back of the device to form a first conductivity type buffer layer, a heavily doped second conductivity type collector region, a heavily doped first conductivity type cathode region, and a collector.

4. The fabrication method for the power semiconductor device according to claim 3, wherein in the step one, the topography of the trench gate structure and the trench auxiliary gate structure is adjusted by controlling etching energy, etching time, and passivation time.

* * * * *